United States Patent [19]

Okuzumi

[11] Patent Number: 5,521,531
[45] Date of Patent: May 28, 1996

[54] CMOS BIDIRECTIONAL TRANSCEIVER/TRANSLATOR OPERATING BETWEEN TWO POWER SUPPLIES OF DIFFERENT VOLTAGES

[75] Inventor: Tetsuya Okuzumi, Tokyo, Japan

[73] Assignee: NEC Corporation, Tokyo, Japan

[21] Appl. No.: 354,796

[22] Filed: Dec. 12, 1994

[30] Foreign Application Priority Data

Dec. 13, 1993 [JP] Japan .................. 5-311829

[51] Int. Cl.$^6$ ............................ H03K 19/0185
[52] U.S. Cl. ................ 326/81; 326/58; 326/68; 326/62
[58] Field of Search .................. 326/80, 81, 58, 326/63, 21, 71, 73; 327/546, 333, 536

[56] References Cited

U.S. PATENT DOCUMENTS

| | | |
|---|---|---|
| 4,853,560 | 8/1989 | Iwamura et al. . |
| 5,180,928 | 1/1993 | Choi ........................ 327/536 |
| 5,266,849 | 11/1993 | Kitahara et al. . |
| 5,300,835 | 4/1994 | Assar et al. . |
| 5,304,872 | 4/1994 | Avraham et al. ........... 326/68 |
| 5,381,062 | 1/1995 | Morris ...................... 326/68 |
| 5,432,465 | 7/1995 | Hsi-Jung et al. ........... 326/38 |

FOREIGN PATENT DOCUMENTS

| | | |
|---|---|---|
| 0082567 | 6/1983 | European Pat. Off. . |
| 0613076 | 8/1994 | European Pat. Off. . |
| 4-227317 | 8/1992 | Japan . |
| 1452160 | 10/1976 | United Kingdom . |

OTHER PUBLICATIONS

Specification for National Semiconductor's 74LVX4245 8-bit Dual Supply Translating Transceiver w/TRI-STATE Outputs; Apr. 1994.

*Primary Examiner*—Edward P. Westin
*Assistant Examiner*—Benjamin D. Driscoll
*Attorney, Agent, or Firm*—Young & Thompson

[57] ABSTRACT

A signal level converting circuit for bidirectional transfer of logic signals between a first and second external logic circuit is disclosed. This signal level converting circuit is provided with a control circuit that generates control signals whose logic values can be arbitrarily set, and at least one bidirectional logic signal level converter. Each logic signal level converter is provided with first and second converting circuits. The first converting circuit is placed by the control signal of a first logic level into a high-impedance state that blocks the transmission of the logic signals between the two external logic circuits, and is placed by the control signal of a second logic level into a low-impedance state that allows transmission of logic signals, together with converting the logic signal level from a first signal level to a second signal level. The second converting circuit is placed by the control signal of the second logic level into a high-impedance state that blocks the transmission of the logic signals between the two external logic circuits, and is placed by the control signal of the first logic level into a low-impedance state that allows transmission of logic signals, together with converting the logic signal level from the second signal level to the first signal level.

7 Claims, 6 Drawing Sheets

CM OS BIDIRECTIONAL TRANSCEIVER/TRANSLATOR OPERATING BETWEEN TWO POWER SUPPLIES OF DIFFERENT VOLTAGES

BACKGROUND OF THE INVENTION

1. Field of the Invention

The present invention relates to a level converting circuit, and particularly to a signal-level converting circuit for bidirectionally transmitted logic signals.

2. Description of the Related Art

When a signal is transferred between circuits having different signal levels, a signal level converting circuit must be provided between the circuits. Conventionally, when only signal level conversion (hereinafter referred to as "level conversion") is intended between circuits, level conversion has been accomplished by an IC for level conversion provided between the two circuits. Such an IC, however, is capable of carrying out level conversion in only one direction of signal transfer between the circuits of differing signal levels. Consequently, in order to carry out level conversion bidirectionally between circuits such as bus lines which handle bidirectional signals, two types of level conversion ICs are necessary. Furthermore, switching between the bidirectional signals necessitates a number of switches corresponding to the signal lines making up the bus line as well as a control circuit for controlling switching of these switches. Hereinafter, level conversion in one direction of signal transfer between circuits of differing signal levels is referred to as one directional conversion, and level conversion in both directions of signal transfer between circuits of differing signal levels is referred to as bidirectional conversion.

Now, an example of the above-described conventional bidirectional conversion circuit will be explained with reference to FIG. 1. FIG. 1 shows a block diagram of an example of a conventional bidirectional conversion circuit which bidirectionally converts a logic signal having a signal level of 5 volts (hereinafter referred to as a "5-V logic signal") and a logic signal having a signal level of 3 volts (hereinafter referred to as a "3-V logic signal").

The bidirectional conversion circuit is equipped with a first switch 32 to which each of 5-V input/output terminals ({1}–{8})31 is connected, a 5-to-3 level converter 33 that converts signal level from 5 volts to 3 volts, a second switch 34, 3-V input/output terminals ({1}–{8}) 35 connected to the second switch 34, a control circuit 36 for controlling switching of the first and second switches 32, 34, a control terminal 37 connected to the control circuit 36, and a 3-to-5 level converter 38 that converts signal level from 3 volts to 5 volts. The 3-volt power source terminal 40 and 5-V power source terminal 41 are connected to 5-to-3 level converter 33 and 3-to-5 level converter 38, respectively.

First will be explained the operation of level conversion from 5 volts to 3 volts (hereinafter referred to as "5-to-3 conversion"). A 5-V logic signal is applied at 5-V input/output terminals 31, and after passing through the first switch 32, the 5-V logic signal is converted to a 3-V logic signal at 5-to-3 level converter 33. This logic signal is delivered to 3-V input/output terminals 35 by way of the second switch 34.

Next will be explained the operation of level-conversion from 3 volts to 5 volts (hereinafter referred to as "3-to-5 conversion").

Control circuit 36 is employed for 3-to-5 conversion. In this case, a synchronous clock signal, control data (information describing which switches to turn on and which switches to turn off), and a strobe signal that controls switching timing are supplied to control terminals 37. In response to the strobe signal, control circuit 36 outputs switching control signals corresponding to the control data. By this switching control signal, each switch of the first and second switches 32, 34 is switched, in this example, in the direction opposite that shown in the figure. The 3-V logic signals are received at 3-V input/output terminals 35, and after passing through the second switch 34, are converted to 5-V logic signals at 3-to-5 level converter 38. Subsequently, the level-converted signals pass through the first switch 32 and are delivered to the 5-V input/output terminals 31.

Regarding the prior art signal level conversion, a circuit is disclosed in Japanese Patent Laid-open 227317 (92). This circuit is an output buffer circuit that converts a CMOS logic level to an ECL logic level. In this circuit, ECL voltage signals of high and low voltage levels are generated in advance by a reference voltage circuit. Signal level conversion from a CMOS level to a ECL level is effected by a switch that operates to connect either of said ECL voltage signals to an ECL load in accordance with the CMOS logic states.

Because the above-described bidirectional conversion circuit of the prior art can execute level conversion using an IC for one directional conversion, level conversion between circuits such as bus lines that handle bidirectional signals necessitates at least two types of level converters as well as switches in a number equal to the number of signal lines making up the bus lines and a control circuit unit for controlling the switches. Consequently, this type of bidirectional conversion circuit of the prior art has the drawback that a large number of parts and connectors are needed, resulting in complex circuit construction.

SUMMARY OF THE INVENTION

The object of the present invention is to provide a signal level converting circuit for bidirectional logic signals that has a simple circuit construction, and that enables arbitrary and easy establishing of desired level conversion when level conversion is required in any of signal transfer directions.

To achieve the above-described object, the signal level converting circuit for bidirectional logic signals of the present invention is a signal level converting circuit for bidirectional logic signals interposed between a first external logic circuit driven by a first power source of a first voltage level and operated by first logic signals having a first signal level equal to the first voltage level, and a second external logic circuit driven by a second power source of a second voltage level and operated by second logic signals having a second signal level identical to the second voltage level, and converts the signal level of logic signals transmitted bidirectionally between the first and second external logic circuits. The signal level converting circuit comprises a control circuit for generating control signals whose logic values may be arbitrarily set, and at least one bidirectional logic signal level converter. Each bidirectional logic signal level converter has:

first input/output terminal means for outputting first logic signals to the first external logic circuit and receiving first logic signals from the first external logic circuit;

second input/output terminal means for outputting second logic signals to the second external logic circuit and receiving second logic signals from the second external logic circuit;

first tristate converting means which is placed by the control signal of the first logic level into a high-impedance state that blocks transmission of logic signals from the second input/output terminal means to the first input/output terminal means, and is placed by the control signal of the second logic level into a low-impedance state that enables transmission of logic signals from the second input/output terminal means to the first input/output terminal means, together with converting the signal level of the second logic signals received at the second input/output terminal means from the second signal level to the first signal level and outputs the converted logic signals to the first input/output terminal means; and second tristate converting means which is placed by the control signal of the second logic level into a high-impedance state that blocks transmission of logic signals from the first input/output terminal means to the second input/output terminal means, and is placed by the control signal of the first logic level into a low-impedance state that enables transmission of logic signals from the first input/output terminal means to the second input/output terminal means together with converting the signal level of the first logic signals received at the first input/output terminal means from the first signal level to the second signal level and outputs the converted signals to the second input/output terminal means.

Owing to the above-described construction, the signal level converting circuit for bidirectional logic signals according to the present invention operates as follows: When the control signal is of the first logic level, the first tristate converting means enters a high-impedance state and the transmission of logic signals is blocked, the second tristate converting means enters a low-impedance state and the first logic signals received at the first input/output terminal means are converted to the second signal level and then sent to the second external logic circuit by way of the second input/output terminal means. When the control signal is of the second logic level, the second tristate converting means enters a high-impedance state and the transmission of logic signals is blocked, the first tristate converting means enters a low-impedance state and the second logic signals received at the second input/output terminal means are converted to the first signal level and then outputted to the first external logic circuit by way of the first input/output terminal means. In this way, bidirectional signal transmission between circuits of differing signal levels is enabled through the use of one control signal.

The first tristate converting means may have a first transferring/blocking means driven by the second power source which, upon receiving the second logic signals from the second input/output terminal means, either transfers or blocks these logic signals under the control of the control signal and outputs a first and second output signal; a first buffer circuit may be provided with a CMOS logic circuit driven by the first power source and having PMOSFET and NMOSFET gates to which the first and second output signals, respectively, are applied. The output of the CMOS logic circuit is transferred to the first input/output terminal means as the output of the first tristate converting means. In this constitution, when the control signal is of the first logic level, the transferring/blocking means outputs, as the first and second output signals, signals to place the PMOSFET and NMOSFET, respectively, in an off state regardless of the logic value of the second logic signal; and when the control signal is of the second logic level, the transferring/blocking means outputs, as the first and second output signals, an identical signal corresponding to the second logic signal, whereby the CMOS logic circuit acts as a CMOS inverter. The output of the CMOS logic circuit is transferred to the first input/output terminal means as the first.logic signal.

The first tristate converting means operates as follows:

The tristate operation of the first tristate converting means is essentially executed by the first buffer circuit. When the control signal is of the first logic level, the first transferring/blocking means generates a first output signal of high level and a second output signal of low level and places the PMOSFET and NMOSFET making up the CMOS logic circuit into off states. As a result, the output of the CMOS logic circuit enters a high-impedance state and the transmission of second logic signals is blocked. When the control signal is of the second logic level, the first transferring/blocking means confers an identical signal corresponding to the second logic signal to the gates of the PMOSFET and NMOSFET, and consequently, the PMOSFET and NMOSFET gates operate as when mutually short-circuited, with the result that the CMOS logic circuit operates as a CMOS inverter. At this time, because the CMOS logic circuit is driven by the first power source, the CMOS logic circuit outputs a signal of the first signal level, i.e., the first logic signal, to the first input/output terminal means as the output of the first tristate converting means. In this way, the first tristate converting means converts the second logic signals received in the second input/output terminal means to the first logic signals and transfers them to the first input/output terminal means.

The first transferring/blocking means can be structured so as to have first and second two-input gate circuits, wherein second logic signals from the second input/output terminal means are applied to the first input terminal of each gate circuit, and control signals are applied to the second input terminal. Thus, when the control signal is of the first logic level, the first gate circuit outputs a high-level signal as the first output signal regardless of the logic state of the second logic signal, and when the control signal is of the second logic level, the first gate circuit outputs a signal corresponding to the second logic signal as the first output signal. Similarly, when the control signal is of the first logic level, the second gate circuit outputs a second output signal of low level regardless of the logic value of the second logic signal, and when the control signal is of the second logic level, the second gate circuit outputs a signal identical to the first output signal as the second output signal.

Whether of positive logic operation or negative logic operation, the operation of the first and second gate circuits making up the first transferring/blocking means is basically identical to the operation of an AND gate or OR gate, and therefore, the use of these gates allows a simple design and inexpensive manufacture.

Due to its simple circuit structure, the first tristate converting means described hereinabove is useful when the signal level of the second logic signal is equal to or higher than the transition threshold voltage of a CMOS logic circuit which operates as a CMOS inverter.

The second tristate converting means may be structured so as to comprise input buffer means driven by the first power source, and signal level converting means, second transferring/blocking means, and a second buffer circuit, each driven by the second power source; wherein the input buffer means is a buffer circuit which inputs a first logic signal from the first input/output terminal means and outputs signals having the first signal level for driving the signal level converting means;

the signal level converting means includes a signal level converting circuit that inputs the output signals of the input buffer means and outputs a logic signal having a logic state corresponding to the first logic signal, and moreover, having the second signal level;

the second transferring/blocking means, upon receiving the output of the signal level converting means, either transfers or blocks the second logic signal under the control of the control signal and outputs first and second output signals;

the second buffer circuit is provided with a second CMOS logic circuit driven by the second power source, and to the PMOSFET and NMOSFET gates of the CMOS logic circuit are applied the first and second output signals of the second transferring/blocking means; and when the control signal is of the second level, the second transferring/blocking means outputs first and second output signals which place the PMOSFET and NMOSFET, respectively, in an off state regardless of the logic value of the output signal of the signal level converting means, and when the control signal is of the first logic level, the second transferring/blocking means outputs as the first and second output signals identical signals corresponding to the output signal of the signal level converting means, and the output of the CMOS logic circuit is transferred to the second input/output terminal means as the second logic signal.

The second transferring/blocking means and the second buffer circuit of the second tristate converting means have the same construction as the first transferring/blocking means and the first buffer means, respectively, and operate in a complementary manner to the first transferring/blocking means and the first buffer means with regard to the logic levels of the control signals. The second tristate converting means differs from the first tristate converting means in that the second tristate converting means is provided with an input buffer means driven by the first power source and a signal level converting means driven by the second power source.

In this case, the signal level converting means can be structured to include a signal level converter which inputs mutually inverted two output signals of the input buffer means and converts their signal levels to the second signal level. This signal level converter has a first FET of a first conductive type with its gate receiving the first output signal of the input buffer means, a second FET of a second conductive type which has a drain connected to the drain of the first FET and which acts as the load transistor of the first FET, a third FET of the first conductive type with its gate receiving the second output signal of the input buffer means, and a fourth FET of the second conductive type which has its drain connected to the drain of the third FET and which acts as a load transistor of the third FET. The gate of the second FET is connected to the first output point, which is a junction of the third and fourth FETs; the gate of the fourth FET is connected to the second output point, which is a junction of the first and second FETs; the sources of the second and fourth FETs are connected to the first electrode of the second power source; the sources of the first and third FETs are connected to the second electrode of the second power source; and a prescribed one of the first and second output points is established as the output terminal of the signal level converter. In addition, it is preferable that the first and third FETs have a greater driving power than the second and fourth FETs.

The above-described signal level converter can, as a whole, make up a positive feedback amplifying circuit, and the first amplifying circuit made up of the first and second FETs and the second amplifying circuit made up of the third and fourth FETs act as positive feedback circuits for each other. As a result, the output signals rise vertically towards the second voltage level and moreover, fall vertically from the second voltage level. It is therefore possible to stably and accurately determine the rising edge and falling edge of the output signal. The reason for structuring the input buffer means so as to allow production of two output signals of mutually inverted phase is to drive the signal level converter to effect such a vertical operation as described above.

The signal level converting means is particularly useful if the first signal level is low enough that the first logic signal cannot directly drive the second transferring/blocking means. In such a case, it is preferable that FETs of large driving power be employed as the first and third FETs in order that the signal level converter will operate stably even for a low input signal level.

The first and second power sources may also include a transformer circuit for transforming the voltage of a prescribed one of the first and second power sources to the voltage of the other power source.

The data processing system of the present invention comprises a first external logic circuit driven by a first power source of a first voltage level and operated by first logic signals having a first signal level equal to the first voltage level, a second external logic circuit driven by a second power source of a second voltage level and operated by second logic signals having a second signal level equal to the second voltage level; and a signal level converting circuit for bidirectional logic signals which converts the signal level of logic signals transmitted bidirectionally between the first and second external logic circuits; the signal level converting circuit for bidirectional logic signals comprising a control circuit for generating control signals whose logic values may be arbitrarily set, and at least one bidirectional logic signal level converter, each bidirectional logic signal level converter comprising first input/output terminal means for outputting first logic signals to the first external logic circuit and inputting first logic signals from the first external logic circuit;

second input/output terminal means for outputting second logic signals to the second external logic circuit and inputting second logic signals from the second external logic circuit;

first tristate converting means which is placed by a control signal of the first logic level into a high-impedance state that blocks transmission of logic signals from the second input/output terminal means to the first input/output terminal means, and is placed by the control signal of the second logic level into a low-impedance state that enables transmission of logic signals from the second input/output terminal means to the first input/output terminal means, together with converting the signal level of the second logic signals received at the second input/output terminal means from the second signal level to the first signal level and outputs the converted signals to the first input/output terminal means; and second tristate converting means which is placed by the control signal of the second logic level into a high-impedance state that blocks transmission of logic signals from the first input/output terminal means to the second input/output terminal means, and is placed by the control signal of the first logic level into a low-impedance state that enables transmission of logic signals from the first input/output terminal means to the second input/output terminal means, together with converting the signal level of the first logic signals received at the first input/output terminal means from the first signal level to the second signal level and transfers the converted logic signals to the second input/output terminal means.

Owing to the ease of setting control signals in the above-described logic signal level converter for bidirectional logic signals, the transmission of information in a data processing system having circuits of differing signal levels can be made easy and inexpensive.

The above and other objects, features, and advantages of the present invention will become apparent from the following description referring to the accompanying drawings which illustrate examples of preferred embodiments of the present invention.

DETAILED DESCRIPTION OF THE PREFERRED EMBODIMENTS

Figure 2:
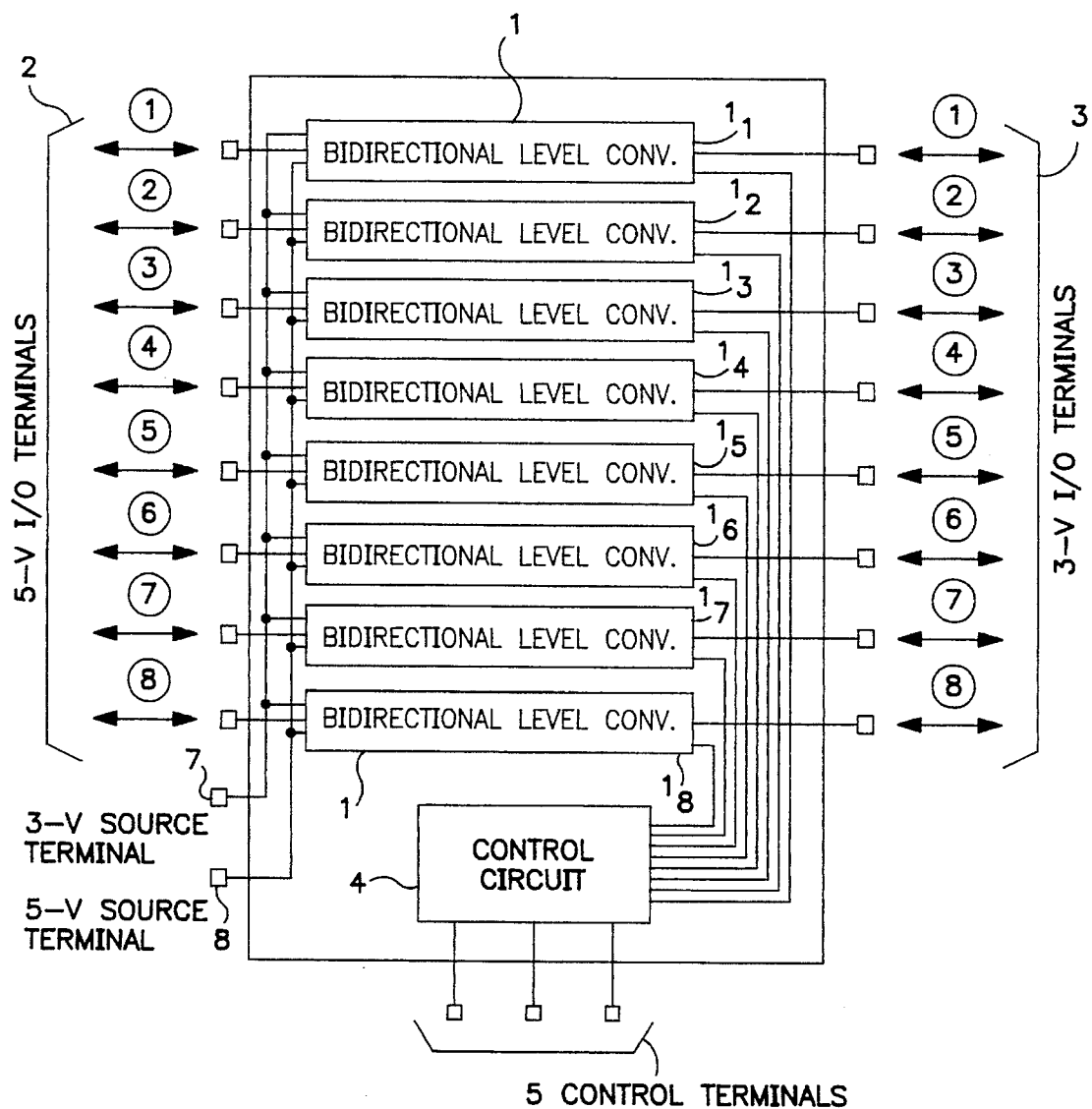
FIG. 2 is a block diagram showing a first embodiment of the signal level converting circuit for bidirectional logic signals according to the present invention.

An embodiment of the signal level converting circuit for bidirectional logic signals according to the present invention will next be explained with reference to the figures. FIG. 2 is a block diagram showing a signal level converting circuit for bidirectional logic signals which carries out 5-to-3 conversion and 3-to-5 conversion, and FIG. 3 shows a circuit diagram of the bidirectional level converter shown in FIG. 2.

Referring first to FIG. 2, the signal level converting circuit for bidirectional logic signals is provided with a plurality of bidirectional logic signal level converters (hereinafter referred to as "bidirectional level converters") 1 and a control circuit unit 4 that controls each of the bidirectional level converters $(1_1, 1_2, 1_3, \ldots 1_8)1$. Further, in FIG. 2, the signal level converting circuit is provided with 5-V input/output terminals ({1}–{8}) 2, one connected to one end of each of the eight bidirectional level converters 1, 3-V input/output terminals 3, one connected to the other end of each of the bidirectional level converters 1, three input terminals 5 connected to the control circuit 4, and 3-V source terminals 7 and 5-V source terminals 8 connected to each of the bidirectional level converters 1.

Figure 3:
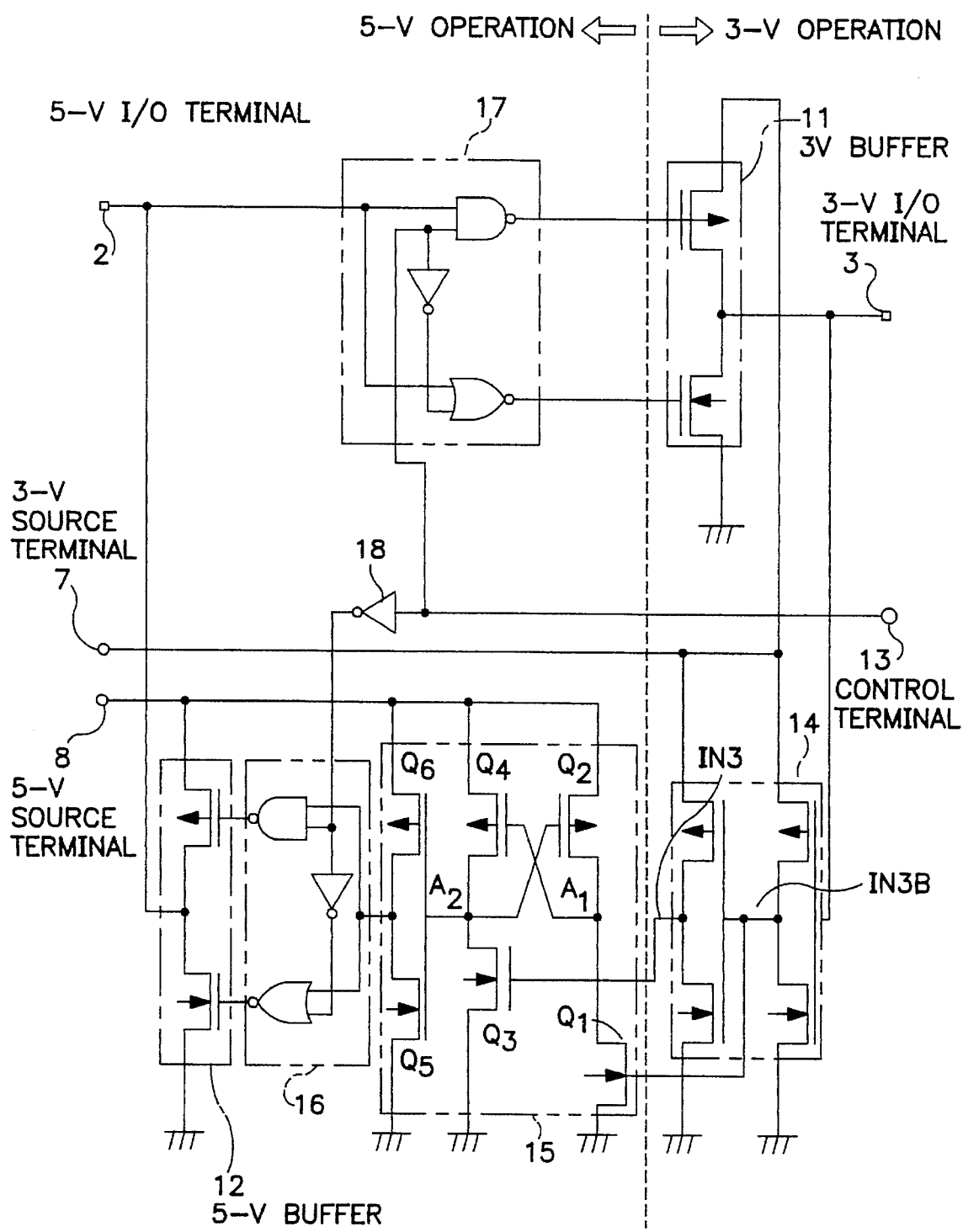
FIG. 3 shows a circuit diagram of the bidirectional level converter shown in FIG. 2.

As shown in FIG. 3, each of the bidirectional level converters 1 is provided with 3-V operation circuit part that operates at 3 volts, 5-V operation circuit part that operates at 5 volts, signal terminals 2, 3, 13, and power terminals 7, 8. As the 3-V operation circuit part, a buffer circuit (first buffer) 11 and an inverter circuit (input buffer circuit) 14 are provided. As the 5-V operation circuit part, a buffer circuit (second buffer) 12, transferring/blocking circuits 16, 17, an inverter 18, and a 3-to-5 converting circuit (signal level converting means) 15 are provided. Of the signal terminals, the 5-V terminal is input/output terminal 2, and the 3-V terminal is input/output terminal 3. Control terminal 13 is provided as the terminal for the control signal. In addition, 3-V terminal 7 and 5-V terminal 8 are provided as power source terminals.

The transferring/blocking circuits 16, 17 have identical structure, each made up of a two-input NAND gate, a two-input NOR gate, and an inverter.

Transferring/blocking circuit 17 receives a 5-V logic signal from 5-V input/output terminal 2, and moreover, receives control signal (gate signal) from control terminal 13. The first input terminals of the NAND gate and the NOR gate receive 5-V logic signals in parallel. The second input terminals of the NAND gate and the NOR gate, respectively, receive the control signal and the inverted control signal inverted by the inverter 18. Accordingly, upon receiving the control signal of logic 0, the NAND gates and NOR gates output logic 1 and logic 0, respectively, as the output of transferring/blocking circuit 17 regardless of the logic state of the 5-V logic signal. In the description hereinbelow, this state is referred to as the "blocking state" of the transferring/blocking circuit. Upon receiving a control signal of logic 1, the NAND gate and NOR gate output an inverted signal of the 5-V logic signal received from 5-V input/output terminal 2. In the description hereinbelow, this state is referred to as the "transferring state."

Transferring/blocking circuit 16 operates identically to transferring/blocking circuit 17. However, because the control signal input of transferring/blocking circuit 16 is inverted by inverter 18, transferring/blocking circuit 16 and transferring/blocking circuit 17 take on mutually inverted logic states, i.e., when transferring/blocking circuit 17 is in the blocking state, transferring/blocking circuit 16 is in the transferring state, and when transferring/blocking circuit 17 is in the transferring state, transferring/blocking circuit 16 is in the blocking state. Transferring/blocking circuit 16 is supplied, as data signals, with 5-V logic signals produced at 3-to-5 converting circuit 15 by level-converting 3-V logic signals received at 3-V input/output terminal 3 from a 3-V external circuit, as will be explained hereinbelow.

Buffer circuits 11 and 12 are a 3-V operation CMOS logic circuit and a 5-V operation CMOS logic circuit, respectively. Outputs of the NAND gates of the transferring/blocking circuits 17, 16 of the previous stages are applied to the gates of the P-channel FETs of buffer circuits 11, 12, respectively; and outputs of the NOR gates of the transferring/blocking circuit 17, 16 are applied to the gates of the N-channel FETs of buffer circuits 11, 12, respectively. As a result, when the control signal is of logic 0, transferring/blocking circuit 17 placed in the blocking state provides signals of logic 1 and logic 0 which are applied to the gates of the P-channel FET and N-channel FET of tristate buffer circuit 11, respectively, and the output of tristate buffer circuit 11 assumes high impedance state. Meanwhile, because transferring/blocking circuit 16 is in the transferring state at this time, 3-V logic signals received at 3-V input/output terminal 3 are transferred through transferring/blocking circuit 16 after being level-converted by 3-to-5 converting circuit 15, are then outputted from the output terminal of buffer circuit 12 as 5-V logic signals, and supplied to the 5-V circuit by way of 5-V input/output terminal 2. At this time, because the two outputs of transferring/blocking circuit 16 are of the same logic state, the CMOS logic circuit of the buffer circuit operates as a CMOS inverter. When he control signal is of logic 1, transferring/blocking circuit 17 is placed in the transferring state, and consequently, 5-V logic signals received at 5-V input/output terminal 2 are transferred through transferring/blocking circuit 17 and, after being level-converted to 3-V signals and inverted by tristate buffer circuit 11, are supplied to the 3-V circuit by way of 3-V input/output terminal 3. At this time as well, the CMOS logic circuit of buffer circuit 11 operates as a CMOS inverter.

Inverter circuit 14 is made up of two 3-V CMOS inverters connected in two stages. The circuit 14 is supplied with 3-V logic signals received at 3-V input/output terminal 3 and provides two outputs, a first output IN3B being the output of the first stage inverter and a second output IN3 being the output of the second stage inverter. Consequently, signal IN3 and signal IN3B have the same signal level of 3 volts, and are mutually inverted.

3-to-5 converting circuit 15 is provided with a first and a second amplifying circuits and an inverter. The first amplifying circuit is made up of N-channel FET $Q_1$ which receives output IN3B of inverter circuit 14 and P-channel FET $Q_2$ which functions as a load transistor of that FET $Q_1$. The second amplifying circuit is made up of N-channel FET $Q_3$ which receives output IN3 of inverter circuit 14 and P-channel FET $Q_4$ which functions as a load transistor of that FET $Q_3$. The inverter is made up of N-channel FET $Q_5$ and P-channel FET $Q_6$. The driving FET $Q_1$, $Q_3$ of each amplifying circuit has a large driving power in order to enable stable operation at low input signal voltage. The sources of load FETs $Q_2$, $Q_4$ are connected to 5-V source terminal 8, and the gates are connected to the output nodes $A_2$, $A_1$ of second and first amplifying circuits, respectively. In addition, the sources of FETs $Q_1$, $Q_3$ are connected to ground potential. The inverter ($Q_5Q_6$) functions as the output buffer of 3-to-5 converting circuit 15.

When the output signals IN3B and IN3 of inverter 14 are respectively logic 1 (3 volts) and logic 0 (ground potential), FET $Q_1$ is on and the potential of output node $A_1$ falls, and as a result, FET $Q_4$ turns on. On the other hand, because FET $Q_3$ is cut off, the potential of output node $A_2$ rises, whereby FET $Q_2$ is cut off. As a result, output node $A_1$ becomes the ground potential (logic 0), and output node $A_2$ becomes 5 volts (logic 1). Conversely, when IN3B is logic 0 (ground potential) and IN3 is logic 1 (3 volts), FET $Q_1$ and FET $Q_4$ are cut off and FET $Q_2$ and FET $Q_3$ are on. As a result, ground potential (logic 0) is outputted from output node $A_2$. Inverter ($Q_5Q_6$) inverts the signal at output node $A_2$. In this way, the overall amplifier circuit (signal level converter) of 3-to-5 converting circuit 15 acts as a feedback amplifying circuit, in which the first and second amplifying circuits acts as each other's positive feedback circuits. As a result, the output rises vertically towards the 5-V signal level and falls vertically from the 5-V signal level. In this way, a logic signal having a signal level of 5 volts, the rising and falling edges of which are stably and accurately defined, can be obtained.

The operation of the bidirectional level converters 1 will next be explained. The basic operation of the bidirectional level converters 1 is as follows:

Transferring/blocking circuit 17 and buffer circuit 11 make up the tristate converting circuits, and when the control signal is logic 0, the first tristate converting circuit is placed in a high-impedance state and transmission of logic signals from input/output terminal 2 to input/output terminal 3 is blocked. When the control signal is logic 1, the first tristate converting circuit is placed in a low-impedance state and, together with transferring logic signals from input/output terminal 2 to input/output terminal 3, converts the signal level of the 5-V logic signals received at input/output terminal 2 from 5 volts to 3 volts and outputs the 3-V signals. On the other hand, the second tristate converting circuit is made up of inverter circuit 14, 3-to-5 converting circuit 15, transferring/blocking circuit 16, and tristate buffer circuit 12, and when the control signals are logic 1, the second tristate converting circuit is placed in a high-impedance state and blocks the transmission of logic signals from input/output terminal 3 to input/output terminal 2. When the control signals are logic 0, the second tristate converting circuit is placed in a low-impedance state and logic signals are transferred from input/output terminal 3 to input/output terminal 2.

Next will be presented a detailed explanation of the operation of the bidirectional level converters 1 of the present embodiment. First, in 5-to-3 conversion, the control signal is set to logic 1. As a result, transferring/blocking circuit 16 is in the blocking state, and the output of buffer circuit 12 becomes high impedance. Transferring/blocking circuit 17 is in the transferring state at this time, and accordingly, 5-V logic signals received at the 5-V input/output terminal 2 pass through transferring/blocking circuit 17, are converted to 3-V logic signals by buffer circuit 11 of 3-V operation, and are transferred to the 3-V external circuit from the 3-V input/output terminal 3. Next, for 3-to-5 conversion, the control signal is set to logic 0. This time, the transferring/blocking circuit 17 is in the blocking state and the output of the buffer circuit 11 becomes high impedance state. As a result, the 3-V logic signals received at the 3-V input/output terminal 3 are supplied to inverter circuit 14 and converted to inverted signals IN3B and non-inverted signals IN3 having a 3-V signal level. Non-inverted signals of 5-V signal level are generated through the above-described operation of 3-to-5 converting circuit 15. The output of 3-to-5 converting circuit 15 is inverted by transferring/blocking circuit 16, once again inverted by the buffer circuit 12, and transmitted as 5-V logic signals to the 5-V external circuit by way of 5-V input/output terminal 2.

The control signals are stored as control data for the operation program of the entire system including the 3-V and 5-V circuits in a programmable ROM, RAM, EEPROM, or a register circuit.

An example of the control circuit unit will next be explained with reference to FIG. 4. The control circuit unit 4 is provided with a shift register 21 having a bit number equal to the number of the bidirectional level converter 1, and a data latch circuit 22 that latches the parallel output of the shift register 21 in synchronization with a strobe signal. In the present embodiment, the shift register 21 is of eight bits, and accordingly, data latch circuit 22 is made up of eight D flip-flops. In synchronization with a clock signal CLK, shift register 21 serially outputs data signal DATA. Each D flip-flop of data latch circuit 22 inputs strobe signal STRB to its clock signal input terminal C, inputs the serial output of the shift register 21 to its data input terminal D, and outputs control signal CONT from its Q terminal.

Figure 4:
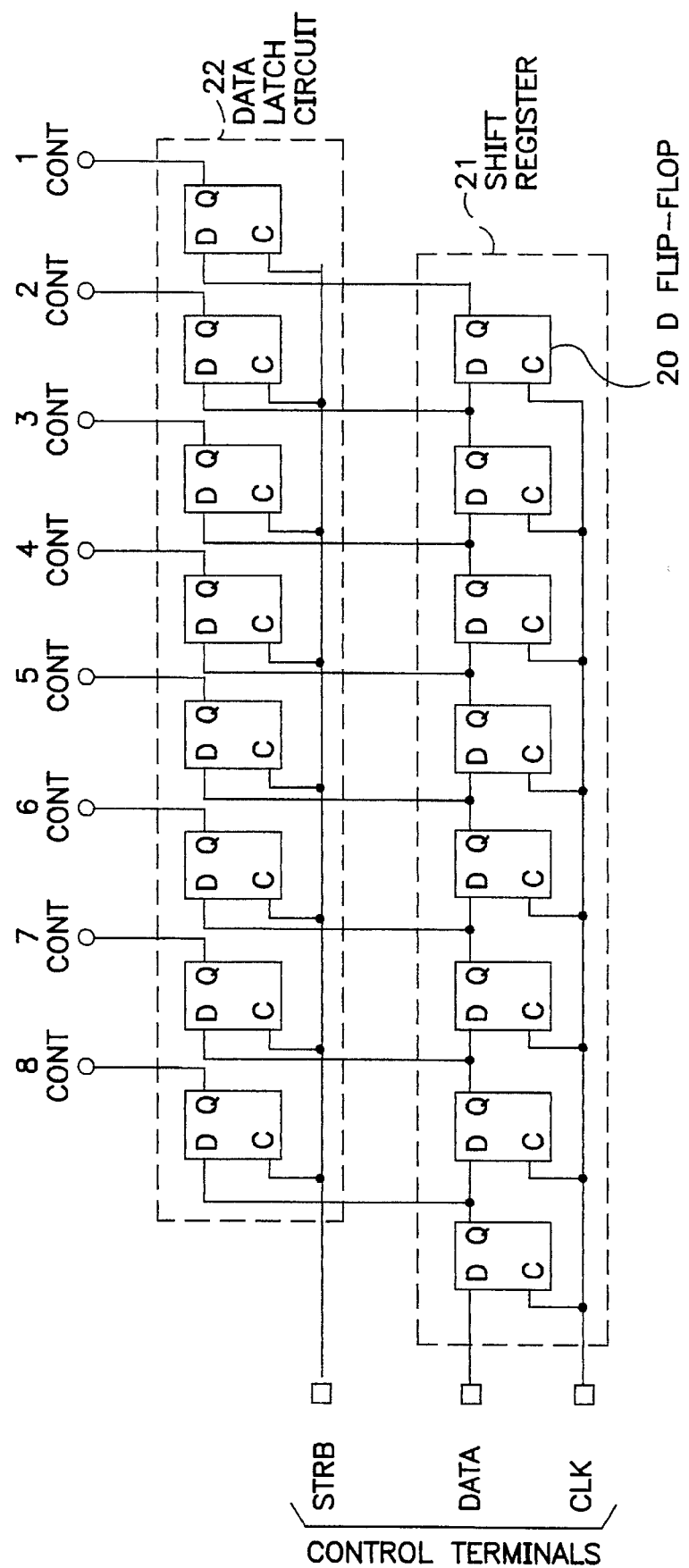
FIG. 4 is a structural diagram of the control circuit shown in FIG. 2.
Figure 5:
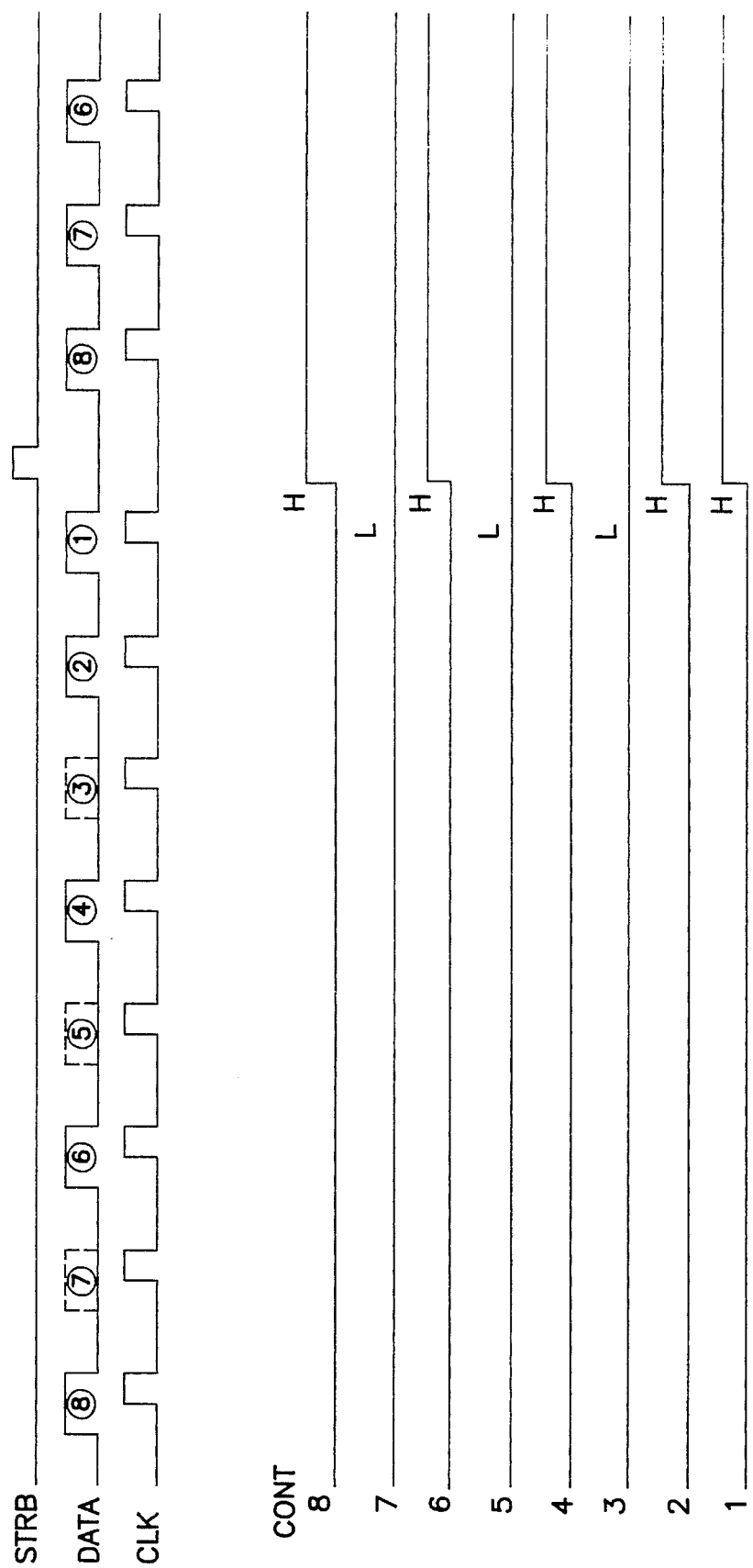
FIG. 5 is timing chart of the input signals and control signals of the control circuit shown in FIG. 4.

FIG. 5 is a timing chart illustrating the operation of the control circuit shown in FIG. 4. In this example, the control terminals of the eight bidirectional level converters 1 are labeled CONT1, CONT2, CONT3 ... CONT8. Control data for causing the first, second, fourth, sixth, and eighth bidirectional level converters to perform 5-to-3 conversion and the third, fifth, and seventh bidirectional level converters to perform 3-to-5 conversion are inputted to the shift register 21. The control data are latched at the rising edge of clock signal CLK, and the latched data are synchronized with clock signal CLK and shifted to the right in FIG. 3. As a result, when data latched first (the data designated {1} in FIG. 4) are stored in the D flip-flop on the right end of shift register 21, logic 1 is stored in the first, second, fourth, sixth, and eighth D flip-flops counting from the right side of shift register 21, and logic 0 is stored in the third, fifth, and seventh D flip-flops. Accordingly, after a corresponding logic value is stored in each D flip-flop of the shift register, strobe signal STRB is applied to data latch circuit 22, whereupon these logic values are latched in data latch circuit 22 and supplied to control terminals CONT1, CONT2, CONT3 . . . CONT8. This process enables the arbitrary setting of the direction of logic signal transmission, and accordingly, the direction of signal level conversion.

Figure 1:
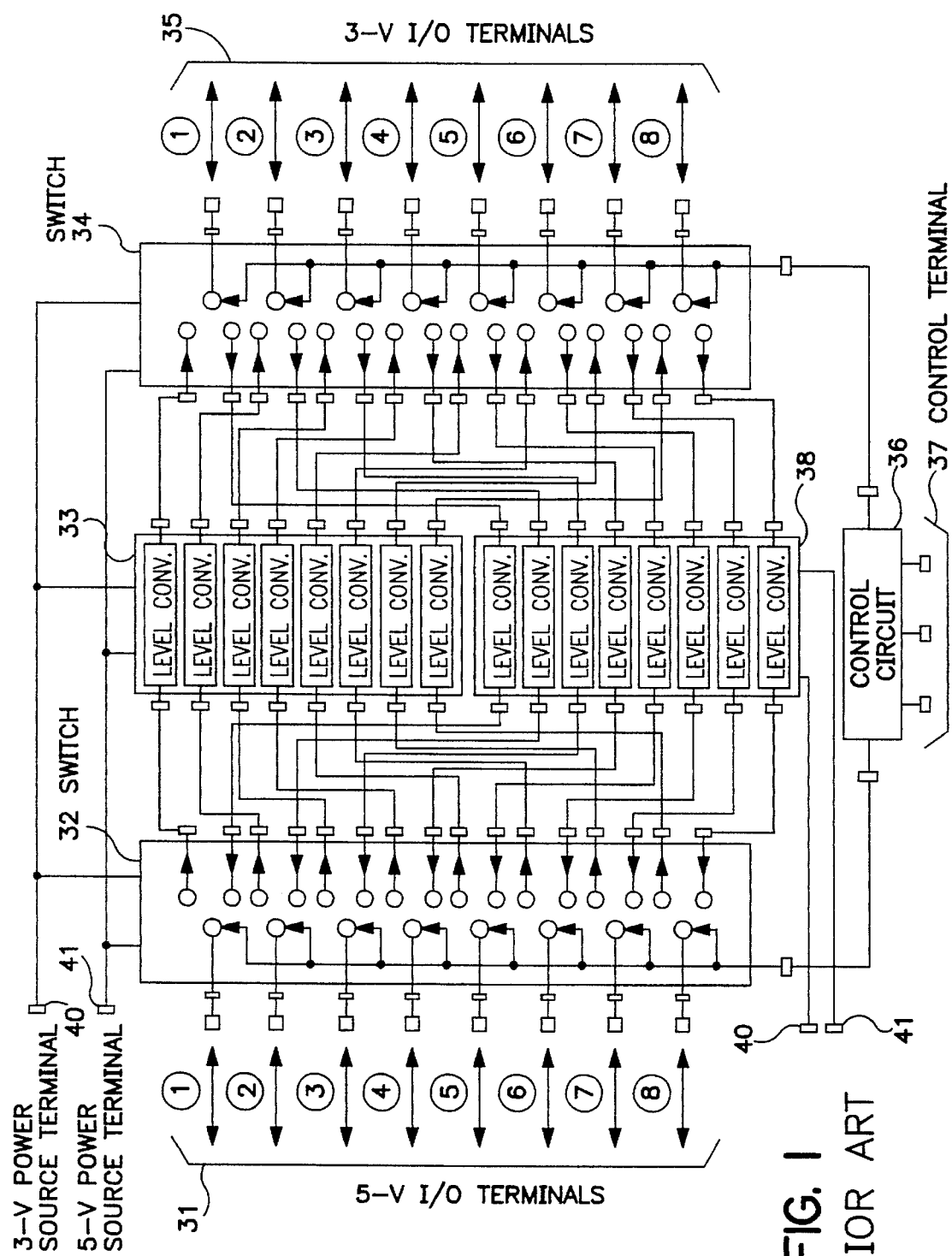
FIG. 1 is a block diagram of a bidirectional conversion circuit according to the prior art.
Figure 6:
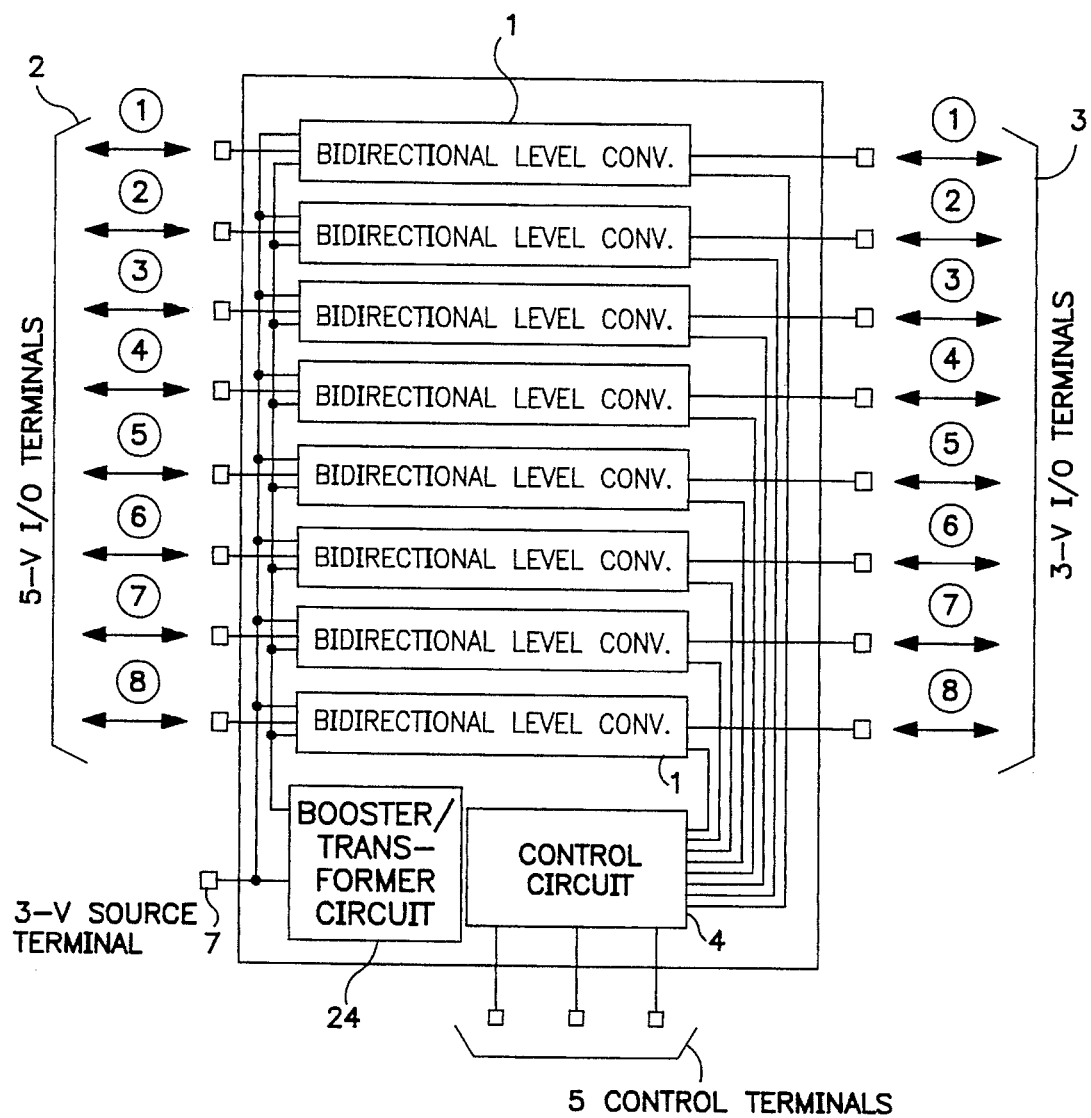
FIG. 6 is a block diagram showing a second embodiment of the signal level converting circuit for bidirectional logic signals according to the present invention.

The signal level converting circuit for bidirectional logic signals shown in FIG. 6 is an embodiment in which a booster circuit unit 24 has been added to the signal level converting circuit for bidirectional logic signals of FIG. 1. The booster circuit unit 24 allows boosting of the 3-V voltage to 5 volts and applying of this 5-V voltage to the bidirectional level converters 1. As a result, in this bidirectional signal level converting circuit, the 5-V power terminal 8 shown in FIG. 3 can be omitted, and similarly, by making the booster circuit unit 24 a step-down transformer circuit, 3-V voltage can be conversely produced from a 5-V power source.

The present invention is summarized as follows:

1) In accordance with the logic level of the control signals, one of first and second tristate converting means is placed in a high-impedance state and the other is placed in a low-impedance state, whereby either signal level conversion from a first signal level to a second signal level, or signal level conversion from a second signal level to a first signal level may be arbitrarily established. In this way, the need for a plurality of switches equal in number to the input/output terminals or for complex connectors can be eliminated. As a result, a signal level converting circuit for bidirectional logic signals which has simple circuit structure and which allows easy setting of control signals can be obtained.

2) If either signal level of two logic signals involved in bidirectional signal transmission is higher than the transition threshold voltage value of a CMOS logic circuit, a signal level converting circuit for bidirectional logic signals of simple circuit structure may be obtained by constructing tristate converting means from only a CMOS logic circuit and transferring/blocking means.

3) By connecting two 2-input gate circuits in parallel and supplying a logic signal to be transmitted to one of the two input terminals of each gate circuit and applying the control signal or a signal corresponding to the control signal to the other input terminals of the gate circuits, a transferring/blocking means of simple circuit structure may be obtained.

4) If the signal level of logic signals to be transmitted is lower than the transition threshold voltage value of the CMOS logic circuit, by amplifying the inverted signals and non-inverted signals of the logic signals using signal level converting means provided with a feedback amplifying circuit made up of two amplifiers each operating as positive feedback circuits for the other, the logic signals can be converted to logic signals having a desired signal level with stable and definitely defined rising and falling edges, whereby the effect described in item 1 above may be realized.

5) Furthermore, incorporation of a booster/step-down circuit to produce an arbitrary voltage enables level conversion with a single power source.

6) Because of the ease of setting of control signals, the exchange of information in a data processing system having circuits of differing signal levels can be accomplished easily and inexpensively.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A signal level converting circuit for bidirectional logic signals, which is interposed between a first external logic circuit and a second external logic circuit and which converts signal levels of logic signals transmitted bidirectionally between said first and second external logic circuits, said first external logic circuit being driven by a first power source of a first voltage level and operated by first logic signals having a first signal level equal to said first voltage level, and said second external logic circuit being driven by a second power source of a second voltage level and operated by second logic signals having a second signal level equal to said second voltage level, comprising a control circuit for generating control signals, logic states of which can be arbitrarily set; and at least one bidirectional logic signal level converter, each bidirectional logic signal level converter comprising:

first input/output terminal means for delivering the first logic signals to said first external logic circuit and receiving the first logic signals from said first external logic circuit;

second input/output terminal means for delivering the second logic signals to said second external logic circuit and receiving the second logic signals from said second external logic circuit;

first tristate converting means which is placed by the control signal of a first logic level into a high-impedance state that blocks transmission of logic signals from said second input/output terminal means to said first input/output terminal means, and is placed by said control signal of a second logic level into a low-impedance state that enables transmission of logic signals from said second input/output terminal means to said first input/output terminal means, and moreover, which converts the signal level of second logic signals received at said second input/output terminal means from said second signal level to said first signal level and transfers the converted logic signals to said first input/output terminal means, said first tristate converting means comprising:

first transferring/blocking means driven by said second power source which, upon receiving second logic signals from said second input/output terminal means, one of transfers and blocks said logic signals under the control of the control signal and outputs a first output signal and a second output signal; and a first buffer circuit provided with a first CMOS logic circuit driven by said first power source, the PMOSFET and NMOSFET gates of said CMOS logic circuit being supplied with said first and second output signals, respectively, and the output of said CMOS logic circuit being transferred to said first input/output terminal means as output of said first tristate converting means;

wherein, when the control signal is of the first logic level, said transferring/blocking means outputs, as first and second output signals, signals to place said PMOSFET and NMOSFET, respectively, in an off state regardless of the logic value of said second logic signal; and when the control signal is of the second logic level, said transferring/blocking means outputs, as said first output signal and said second output signal, an identical signal corresponding to said second logic signal; and the output of said CMOS logic circuit is transferred to said first input/output terminal means as said first logic signal; and second tristate converting means which is placed by said control signal of the second logic level into a high-impedance state that blocks transmission of logic signals from said first input/output terminal means to said second input/output terminal means, and is placed by said control signal of the first logic level into a low-impedance state that enables transmission of logic signals from said first input/output terminal means to said second input/output terminal means, and moreover, which converts the signal level of said first logic signals received at said first input/output terminal means from said first signal level to said second signal level and transfers the converted logic signals to said second input/output terminal means.

2. The circuit according to claim 1 wherein said first and second power sources include a prescribed one of said first and second power sources and a transformer circuit that transforms voltage from the voltage of said prescribed power source to the voltage of the other power source.

3. A circuit according to claim 1 wherein said first transferring/blocking means comprises a first two-input gate circuit and a second two-input gate circuit, wherein second logic signals from said second input/output terminal means are applied to a first input terminal of each gate circuit, and said control signal is applied to a second input terminal of each gate circuit; and when said control signal is of the first logic level, said first gate circuit outputs a high-level signal as the first output signal regardless of the logic value of said second logic signal; when said control signal is of the second logic level, said first gate circuit outputs a signal corresponding to said second logic signal as a first output signal; when a control signal is of said first logic level, said second gate circuit outputs the second output signal of low level regardless of the logic value of said second logic signal; and when the control signal is of the second logic level, said second gate circuit outputs a signal identical to said first output signal as the second output signal.

4. A circuit according to claim 1, wherein said second tristate converting means comprises input buffer means driven by said first power source; and signal level converting means, second transferring/blocking means, and a second buffer circuit, each driven by said second power source;

wherein said input buffer means is a buffer circuit which is supplied with a first logic signal from said first input/output terminal means and outputs signals having said first signal level for driving said signal level converting means;

said signal level converting means includes a signal level converting circuit that receives the output signals of said input buffer means and outputs a logic signal having a logic state corresponding to said first logic signal, and having said second signal level;

said second transferring/blocking means, upon receiving output of said signal level converting means, either transfers or blocks said second logic signal under the control of the control signal and outputs first and second output signals;

said second buffer circuit is provided with a second CMOS logic circuit driven by said second power source, and the PMOSFET and NMOSFET gates of said second CMOS logic circuit are supplied with said first and second output signals of said second transferring/blocking means; and when the control signal is of the second level, said second transferring/blocking means outputs first and second output signals which place said PMOSFET and NMOSFET, respectively, in an off state regardless of the logic value of the output signal of said signal level converting means, and when the control signal is of the first logic level, said second transferring/blocking means outputs, as first and second output signals, identical signals corresponding to the output signal of said signal level converting means, and the output of said second CMOS logic circuit is transferred to the second input/output terminal means as a second logic signal.

5. A circuit according to claim 4 wherein said input buffer means includes CMOS inverters connected in two stages and provides two output signals, a first output signal being an output of the first stage CMOS inverter and a second output signal being an output of the second stage CMOS inverter; and said signal level converting circuit receives the two output signals of the input buffer means and converts the signal levels to said second signal level, said signal level converting circuit having a first FET of a first conductive type having a gate receiving said first output signal of said input buffer means, a second FET of a second conductive type which has a drain connected to a drain of said first FET and which acts as a load transistor of said first FET, a third FET of said first conductive type having a gate receiving said second output signal of said input buffer means, and a fourth FET of said second conductive type having a drain connected to a drain of said third FET and which acts as a load transistor of said third FET; said gate of said second FET is connected to a first output point, which is a junction of said third and fourth FETs; the gate of said fourth FET is connected to a second output point, which is a junction of said first and second FETs; the sources of said second and fourth FETs are connected to the first electrode of said second power source; the sources of said first and third FETs are connected to the second electrode of said second power source; and a prescribed one of said first and second output points is determined as the output terminal of said signal level converter.

6. The circuit according to claim 5 wherein said first and third FETs have a greater driving force than said second and fourth FETs.

7. A data processing system, comprising:

a first external logic circuit driven by a first power source of a first voltage level and operated by first logic signals having a first signal level identical to said first voltage level, a second external logic circuit driven by a second power source of a second voltage level and operated by second logic signals having a second signal level identical to said second voltage level, and a signal level converting circuit for bidirectional logic signals interposed between said first and second external logic circuits which converts the signal level of logic signals transmitted bidirectionally between said first and second external logic circuits;

said signal level converting circuit for bidirectional logic signals comprising a control circuit for generating control signals, logic states of which can be arbitrarily set; and at least one bidirectional logic signal level converter, each of said at least one bidirectional logic signal lever converter comprising:

first input/output terminal means for delivering the first logic signals to said first external logic circuit and receiving the first logic signals from said first external logic circuit;

second input/output terminal means for delivering the second logic signals to said second external logic circuit and receiving the second logic signals from said second external logic circuit;

first tristate converting means which is placed by the control signal of a first logic level into a high-impedance state that blocks transmission of logic signals from said second input/output terminal means to said first input/output terminal means, and is placed by the control signal of a second logic level into a low-impedance state that enables transmission of logic signals from said second input/output terminals means to said first input/output terminal means, and moreover, which converts the signal level of second logic signals received at said second input/output terminal means from said second signal level to said first signal level and transfers the converted logic signals to said first input/output terminal means, said first tristate converting means comprising:

first transferring/blocking means driven by said second power source which, upon receiving second logic signals from said second input/output terminal means, one of transfers and blocks said logic signals under the control of the control signal and outputs a first output signal and a second output signal; and a first buffer circuit provided with a first CMOS logic circuit driven by said first power source, the PMOSFET and NMOSFET gates of said CMOS logic circuit being supplied with said first and second output signals, respectively, and the output of said CMOS logic circuit being transferred to said first input/output terminal means as output of said first tristate converting means;

wherein, when the control signal is of the first logic level, said transferring/blocking means outputs, as first and second output signals, signals to place said PMOSFET and NMOSFET, respectively, in an off state regardless of the logic value of said second logic signal; and when the control signal is of the second logic level, said transferring/blocking means outputs, as said first output signal and said second output signal, an identical signal corresponding to said second logic signal; and the output of said CMOS logic circuit is transferred to said first input/output terminal means as said first logic signal; and second tristate converting means which is placed by said control signal of the second logic level into a high-impedance state that blocks transmission of logic signals from said first input/output terminal means to said second input/output terminal means, and is placed by said control signal of the first logic level into a low-impedance state that enables transmission of logic signals from said first input/output terminal means to said second input/output terminal means, and moreover, which converts the signal level of said first logic signals received at said first input/output terminal means from said first signal level to said second signal level and transfers the converted logic signals to said second input/output terminal means.

* * * * *